United States Patent [19]

Hahn

[11] Patent Number: 5,165,770
[45] Date of Patent: Nov. 24, 1992

[54] ELECTRONIC EQUIPMENT MODULAR CABINET SYSTEM

[76] Inventor: Richard Hahn, Box 6367, St. Louis, Mo. 63107

[21] Appl. No.: 677,168

[22] Filed: Mar. 29, 1991

[51] Int. Cl.$^5$ .............................................. A47B 47/00
[52] U.S. Cl. .............................. 312/265.4; 312/265.6; 211/26
[58] Field of Search ............... 312/257.1, 265.1–265.2, 312/265.3, 265.4, 265.5, 265.6; 211/26; 361/394; 16/229

[56] References Cited

U.S. PATENT DOCUMENTS

| | | | |
|---|---|---|---|
| 3,192,306 | 6/1965 | Skonnord | 312/265.5 X |
| 3,274,451 | 9/1966 | Laity | 312/265.5 X |
| 3,404,931 | 10/1968 | Fall et al. | 312/265.4 |
| 4,274,547 | 6/1981 | Takagi et al. | 312/265.5 |
| 4,433,884 | 2/1984 | Edwards et al. | 312/250 X |
| 4,620,392 | 11/1986 | Kerpers et al. | 16/229 X |

FOREIGN PATENT DOCUMENTS 2305630  6/1971  France ............... 312/265.4

Primary Examiner—Joseph Falk
Attorney, Agent, or Firm—Polster, Lieder, Woodruff & Lucchesi

[57] ABSTRACT

A modular electronic equipment cabinet system has a support structure constructed primarily of steel tubing of square cross-section. The support structure is integrally welded to provide a cabinet of maximum strength, minimum size, minimum expense and minimum weight, when compared to prior art cabinet systems utilizing formed, sheet metal support structures. The use of steel tubing also facilitates other advantages: superior door hinge design, stronger bottom dust skirt structure, the provision for interchangeable leg levelers and casters which produce greater stability, and a unique side wall panel design. Novel air vent louvers are also disclosed.

12 Claims, 1 Drawing Sheet

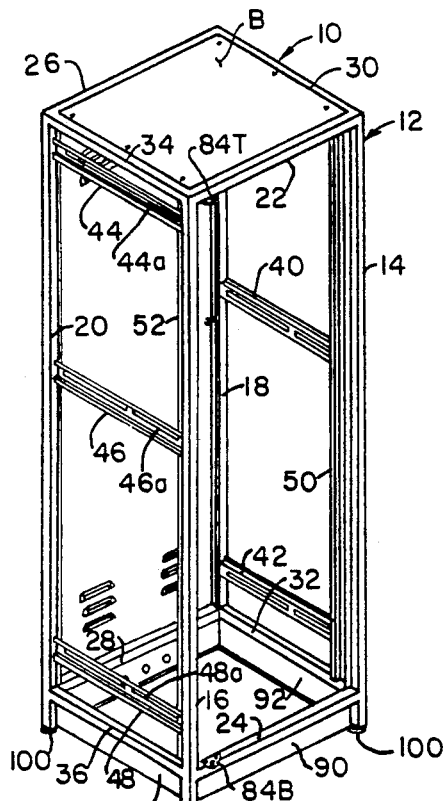
FIG.1.
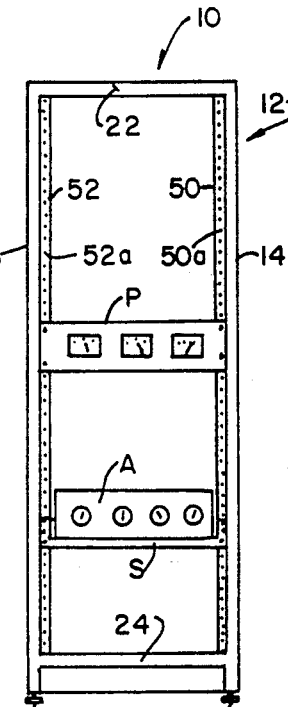
FIG.2.
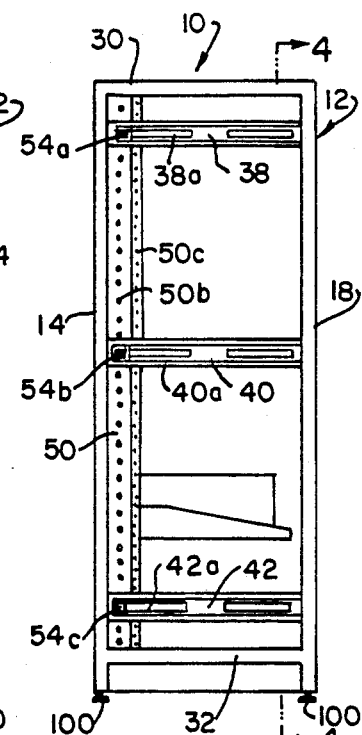
FIG.3.
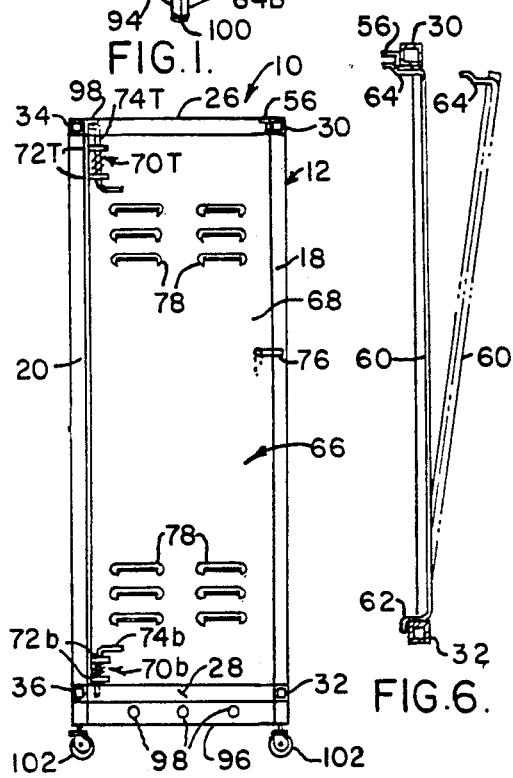
FIG.4.
FIG.6.
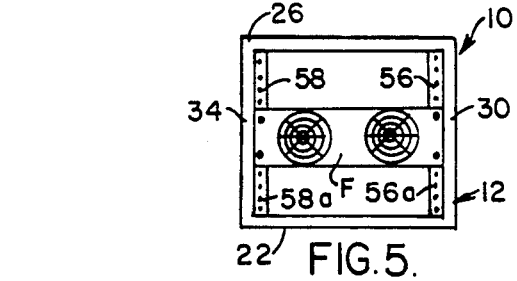
FIG.5.
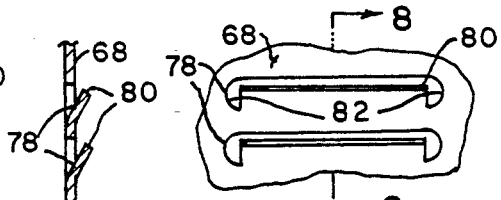
FIG.8. FIG.7.
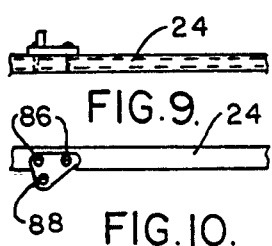
FIG.9.
FIG.10.

ELECTRONIC EQUIPMENT MODULAR CABINET SYSTEM

BACKGROUND OF THE INVENTION

The present invention relates to a novel cabinet structure for supporting and enclosing vertically stacked electronic equipment such as sound amplifiers, switches, gauges, speakers, tape decks, electric receptacles, video monitors, ventilating fans and equipment pull-out drawers. It is well known to provide cabinet structures, also known as electronic or industrial equipment racks, which allow the user to secure any combination of desired equipment in any desired order along the vertical extent of each cabinet. Multiple cabinets may also be placed side-to-side in modular fashion to enclose any number of electronic components. Such systems may be utilized for a miraid of different applications, for example, to house an audio amplification and distribution system for a school or factory.

Prior art equipment cabinets have been constructed almost exclusively of formed, sheet metal. In order to provide sufficient strength the sheet metal is fabricated with multiple bends or convolutions. This convoluted steel is utilized as corner posts and are tack welded to formed, sheet metal top and bottom pieces to produce the cabinet support structure. In order to neatly and aesthetically place or bank multiple cabinets laterally, it is important that they be perfectly rectangular and rest level on the floor. To this end the sheet metal must be provided with multiple bends properly dimensioned with tolerances to the thousandths of an inch. Utilizing this method of construction will inevitably produce imperfections in component parts resulting in cabinets which are difficult and more expensive to assemble and possibly imperfect in banked appearance.

Further problems which have been associated with formed, sheet metal construction are the lack of suitable, inexpensive floor leveling means; lack of caster attachment means which do not cause instability difficulties; lack of an easily removable aesthetically pleasing side wall panel which is substantially tamper-proof; and the lack of inexpensive, strong and simple door hinge structures for front and rear cabinet doors.

Another prior art cabinet has utilized a frame comprised of aluminum extrusions connected at the corners by die cast elements with set screws. This approach has proven to be much more expensive than that of formed sheet metal cabinets or that of the present invention and has therefore not been widely accepted.

SUMMARY OF THE INVENTION

An object of the present invention is to provide an electronic or industrial equipment cabinet or rack structure fabricated of a superstructure comprised of integrally-welded, tubular steel of rectangular, preferably square, cross-section.

It is a further object of the invention to provide a modular cabinet system which is easier and less expensive to manufacture and will produce a cabinet which may be floor leveled and aesthetically banked side-to-side with additional cabinets.

It is still further objects of the invention to provide an electronic equipment cabinet structure which may be utilized with casters without destabilizing the structure, to provide an aesthetically pleasing, tamper-proof but easily installed and removable side panel structure, and strong, simple and inexpensive hinge structures for front and back cabinet doors.

It is another object of the invention to provide an electronic equipment cabinet having a unique air vent louver design which allows increased air flow, decreased dust contamination and which is aesthetically pleasing.

Generally speaking, the modular electronic equipment cabinet system of the present invention comprises four vertical tubular steel, square cross-section, upright members integrally welded with four top and four bottom tubular steel, square cross-section members to form a superior cabinet superstructure embodying many advantages over the prior art. Formed sheet metal, vertically extending mounting rails are secured adjacent the front corner posts to permit the attachment and support of electronic equipment within the superstructure.

The novel cabinet superstructure of the present invention facilitates and produces the many advantages pointed out hereinabove as will be more specifically described hereinafter. These as well as other objects and advantages of the present invention will become more readily apparent upon a reading of the following description of the preferred embodiment in conjunction with the drawings wherein:

BRIEF DESCRIPTION OF THE DRAWINGS

FIG. 1 is an isometric view of a preferred embodiment of the present invention showing the superstructure of an electronic equipment cabinet with a rear door, top panel and floor dust skirts thereon;

FIG. 2 is a front elevational view of the cabinet superstructure showing some representative electronic equipment mounted therein;

FIG. 3 is a right side elevational view of the cabinet structure with the representative electronic equipment of FIG. 2;

FIG. 4 is an elevational view of the inside of the rear door of the showing the rear hinge assembly;

FIG. 5 is a top plan view of a cabinet showing a representative dual fan panel mounted thereon;

FIG. 6 is a cross-sectional view of a side panel spring locked onto the superstructure of a cabinet and showing in phantom line the panel being removed from the superstructure;

FIG. 7 an enlarged cut-away of a portion of the rear door viewed from the inside showing the novel air vent louver design;

FIG. 8 is a cross-sectional view taken along line 8—8 of FIG. 7;

FIG. 9 an enlarged cutaway, front view of a portion of the lower front horizontal member showing a front door hinge design; and FIG. 10 an enlarged cutaway, top view of the hinge of FIG. 9.

DETAILED DESCRIPTION OF THE PREFERRED EMBODIMENT

With reference to the drawings and FIGS. 1-3 in particular, there is shown a modular electronic equipment cabinet structure constructed according to the principles of the present invention and generally referred to by the numeral 10. Cabinet 10 employs a novel superstructure 12 comprised of a first front corner vertical upright member 14, a second front corner vertical upright member 16, a first rear vertical upright member 18, a second rear vertical upright member 20, a top front horizontal member 22, a bottom front horizontal member 24, a top rear horizontal member 26, a bottom rear horizontal member 28, a top right side horizontal member 30, bottom right side horizontal member 32, a top left horizontal member 34 and a bottom left horizontal member 36. All of the members 14, 16, 18, 20, 22, 24, 26, 28, 30, 32, 34 and 36 which form superstructure 12 are fabricated of metal tubing of rectangular cross-section, preferably steel tubing of square cross-section having a one-inch outside side dimension.

Top horizontal members 22, 26, 30 and 34 are located in the same horizontal plane at the upper terminus of upright members 14, 16, 18 and 20, and are integrally welded thereto to provide a smooth rectangular corner appearance. Bottom horizontal members 24, 28, 32 and 36 are located in the same horizontal plane a few inches above the lower ends of upright members 14, 16, 18 and 20, and are integrally welded thereto to provide a smooth rectangular, finished appearance.

In order to further strengthen superstructure 12 and to provide strong support for electronic equipment to be vertically stacked therein, as will be explained in detail hereinafter, there are provided a plurality of right side support brackets 38, 40 and 42 welded between vertical members 14 and 18 in vertically spaced horizontal locations; and a plurality of left side support brackets 44, 46 and 48 welded between vertical members 16 and 20 in vertically spaced horizontal locations, preferably at the same horizontal levels as respective ones of the right side support brackets. All of the support brackets 38, 40, 42, 44, 46 and 48 are fabricated of formed sheet steel, and are formed with horizontal mounting slots 38a, 40a, 42a, 44a, 46a and 48a, respectively.

Positioned on support brackets (known in the art as "hat section" type brackets) 38, 40 and 42 is a right side vertical mounting rail 50, and positioned on brackets 44, 46 and 48 is a are fabricated of formed sheet steel and include a plurality of vertically-spaced forwardly-directed mounting holes 50a and 52a respectively, and a plurality of vertically-spaced sideward-directed attachment holes 50b shown on mounting rail 50 in FIG. 3. Another series of vertically-spaced sideward-directed holes 50c are shown in FIG. 3; however, these holes are not utilized in practice and are included only to facilitate formation of the mounting rails and to reduce the weight of the mounting rails 50 and 52.

Mounting rail 50 is securely attached to hat section brackets 38, 40 and 42 by means of nut and bolt assemblies 54a, 54b, 54c, respectively, which pass through a respective one of attachment holes 50b and a respective one of horizontal mounting slots 38a, 40a, 42a. It can be seen that the position of mounting rail 50 can be adjusted on support brackets 38, 40, 42 such that it may be either fully forward as shown, or placed somewhat rearwardly, depending upon the nature of the equipment to be housed therein. In any case mounting rail 50 will be adjacent vertical member 14 as will similarly be mounting rail 52 to vertical member 16 on support brackets 44, 46, 48.

In use, mounting rails 50 and 52 will serve to secure electronic equipment in vertically-stacked fashion within cabinet structure 10. For example, an amplifier A may be placed upon a shelf S which is attached by means of screws through mounting holes 50a, 52a of mounting rails 50, 52, respectively. Likewise a gauge or meter panel P may be attached to mounting rails 50, 52 at a different vertical location along the mounting rails. Cabinet 10 may be filled with as many electronic components as space will allow. In the event that the cabinet is not filled, then a blank sheet metal panel (not shown) may be installed on the mounting rails to provide an aesthetically pleasing appearance and to provide protection from tampering with the connectors and wires attached to the rear of the equipment (not shown) It is noted that the holes 50a, 52a on mounting rails 50, 52, respectively, are punched at intervals according to Electronic Industry Association (EIA) standards to permit proper fit of EIA standard component panels and accessories.

FIG. 5 shows the top of cabinet 10 comprised of horizontal members 22, 26, 30 and 34. Welded to the inside lateral surface of member 30 is a top mounting rail or bracket 56 and welded to the inside lateral surface of member 34 is a top mounting rail or bracket 58. Each of brackets 56 and 58 include spaced, upwardly-directed mounting holes 56a, 58a, respectively, which are used to support and secure either a blank sheet metal panel B as shown in FIG. 1, or any combination of equipment such as fan assembly F (FIG. 5) in conjunction with small blank panels (not shown). Brackets 56, 58 are positioned on members 30, 34 respectively such that when the sheet metal panel B or sheet metal portion of fan assembly F is positioned thereon, the exterior surface of the sheet metal will be in the same horizontal plane with the top surface of members 22, 26, 30, 34 to present a smooth, pleasing appearance.

In many applications, cabinet 10 will be utilized in combination with additional like cabinets banked side-to-side. When this is the case, it is not necessary or economically desirable to provide side walls or panels between such banked units. However, it is necessary for the protection of the electronic equipment to provide a side wall on any exposed side. To this end, as shown in FIG. 6, there is provided a side panel 60.

Side panel 60 may be utilized on either the right or left side of cabinet 10 and is comprised of a rectangle of formed sheet steel having a lip extending along the bottom edge thereof and a steel spring clip member 64 placed centrally on the upper edge thereof.

As can be readily seen in FIG. 6, the bottom lip 62 of side panel 60 may be placed on and over member 32 and then panel 60 is pivoted into place until spring clip 64 engages member 30 to hold side panel 60 in place. Side panel 60 is sized and formed such that when in place, the outside surface thereof will provide a smooth planar appearance with members 14, 32, 18 and 30. It may also be readily seen that side panel 60 will provide the same function and advantages when used on the left side of cabinet 10. Side panel 10 provides a great degree of resistance to tampering with the electronic equipment in cabinet 10 in that it is very difficult to remove the panel from the outside of cabinet 10, yet those authorized to have access to the interior of cabinet 10 may easily remove panel 60 by merely applying downward and outward pressure to spring clip 64. Hence, necessary repair of the electronic equipment enclosed in cabinet 10 may be more easily facilitated. In the past it was sometimes necessary to remove electronic equipment from the cabinet in order to reach interior screws holding side panels in place.

Turning to FIG. 4, there is shown a rear door assembly 66 which comprises a rear door, formed, sheet-metal panel 68 which fits into the rectangular space created by members 18, 28, 20 and 26. Door panel 68 is provided with top and bottom hinge assemblies 70T, 70B respectively. Each hinge assembly includes a pair of brackets 72T and 72B, respectively which hold a spring-loaded hinge pin 74T, 74B, respectively. Hinge pins 74T, 74B are adapted to be pulled against spring pressure and then inserted into holes provided in members 26 and 28 respectively to pivotally hold door panel 68 in place. A rotating keyed latch 76 is provided on door panel 68 to restrict opening of rear door panel 68 to authorized personnel only. It can be seen that door panel 68 provides a secure closure and a strong hinge mechanism; however, the door panel 68 may be removed from superstructure 12 in a facile manner by personnel authorized to open keyed latch 76.

Door panel 68 includes a plurality of uniquely formed air vent louvers 78, which as shown in greater detail in FIGS. 7 and 8, are formed by cutting the sheet metal along a limited horizontal extent and bending the top of a vent lip 80 inwardly. At the same time a substantially semi-circular portion at each end of the lip 80 is cut out at 82 to provide an aesthetically pleasing appearance and allowing for greater air flow. Also dust which strikes or falls on lip 80 will be directed by gravity outward of cabinet 10 and away from the electronic equipment therein.

Shown in FIGS. 1, 9 and 10 is a novel front door top and bottom, offset hinge bracket pair 84T, 84B. Brackets 84T, 84B each include a flat steel piece having a pair of mounting holes 86 therein and a hinge pin 88 offset from the line between holes 86. Hinge brackets 84T, 84B may be screwed directly to horizontal members 22, 24 to provide a superior front door support. Hinge pins 88 are offset outwardly from cabinet 10 so that the front door (not shown) may be offset outwardly to prevent interference with the knobs or other parts of the electronic equipment therein. Further, if it is desired to change the door from a left hand hinge to a right hand hinge, it is contemplated that hinges 84T, 84B may be switched left to right and top to bottom to provide the same strong hinge assembly with the same hinge parts.

In order to provide protection from dust contamination of the electronic equipment, a front dust skirt 90, a right side dust skirt 92, a left side dust skirt 94 and a rear dust skirt 96 are included on cabinet assembly 10. Dust skirts 90, 92, 94, 96 are fabricated of formed sheet steel and are welded to adjacent superstructure members to provide strong resistance to damage from kicks or the like. Rear dust skirt 96 is provided with a plurality of knock outs 98 for the passage of electric wires therethrough from the electronic equipment in cabinet 10. It is also contemplated that rear dust skirt 96 be removed completely in the event that an excessively large number of wires need to pass into cabinet 10 for a particular application.

At the bottom of each upright superstructure member 14, 16, 18, 20, there are located and secured into the interior of the steel tubing, a screw-type leg leveler 100 for adjusting cabinet 10 to an uneven floor to prevent cabinet 10 from shifting. If it is desired to modify cabinet 10 so that it is mobile, leg levelers 100 may be removed and casters 102 (FIG. 4) may be inserted into the bottom of the hollow tubing forming uprights 14, 16, 18, 20. In this manner the casters will be located at the outer corners of the cabinet bottom giving maximum support and minimizing the possibility of tipping cabinet 10 when pushing it along an uneven floor. Prior art cabinets often utilize a metal pan having casters located inwardly of the cabinet corners thus producing a relatively less stable system.

In order to accept known electronic equipment components constructed according to EIA standards, the distance between uprights 14 and 16 is constructed to be 19 inches, and the distance between uprights 16 and 20 is constructed to be 17½ inches. Due to the fact that the uprights are each of one inch side dimension, the total width of cabinet structure 10 is only 21 inches and the depth is only 19½ inches, which is less than prior art cabinets having the same internal dimensions. It is also noted that the distance between uprights 16 and 20 may be 24 inches or 30 inches per EIA standards.

It can thus be seen that the novel electronic equipment modular cabinet structure described hereinabove accomplishes the objects and advantages of the present invention. Since numerous modifications may be made to the preferred embodiment as described herein without departing from the spirit and scope of the invention, the invention is limited solely by the following claims as may be interpreted within the bounds of the doctrine of equivalents.

What is claimed is:

1. A modular electronic equipment cabinet system comprising:
    first and second front vertical upright members;
    first and second rear vertical upright members;
    top and bottom front horizontal members integrally welded to said first and second front upright members;
    top and bottom rear horizontal members integrally welded to said first and second rear vertical members;
    top and bottom right side horizontal members integrally welded to said first front upright member and said first rear upright member;
    top and bottom left side horizontal members integrally welded to said second front upright member and said second rear upright member;
    said upright members and said horizontal members being fabricated of metal tubing of rectangular cross-section;
    a plurality of right side support brackets attached to and extending between said first front upright member and said first rear upright member;
    a plurality of left side support brackets attached to and extending between said second front upright member and said second rear upright member;
    a first side vertical mounting rail attached to said plurality of right side support brackets;
    a second side vertical mounting rail attached to said plurality of left side support brackets; and
    said mounting rails being fabricated of formed sheet metal and having a plurality of vertically-spaced, forwardly-directed mounting holes therein for supporting electronic equipment thereon.

2. A modular cabinet system as specified in claim 1 and further comprising:
    said top horizontal members being located in the same horizontal plane at the upper terminus of said upright members and being integrally welded thereto;
    a pair of top mounting rails adjacent parallel ones of said top members and having a plurality of upwardly-directed holes therein spaced along the extent thereof.

3. A modular cabinet system as specified in claim 1 and further comprising:
    said bottom horizontal members being located in the same horizontal plane above the lower terminus of said upright members and being integrally welded thereto; and a sheet metal skirt member below said front bottom horizontal member and extending between said front upright members.

4. A modular cabinet system as specified in claim 1 wherein:

the bottom of said upright members being open to interchangeably receive leveler means and caster means.

5. A modular cabinet system as specified in claim 1 and further comprising:

a formed sheet metal side panel adapted to be inserted within and be externally flush wit the rectangle formed by respective front, rear, top and bottom tubular members;

said side panel including a lower lip adapted to engage and rest upon said bottom tubular member and including a spring latch means at the upper end thereof for engagement with said top member to releasably hold said side panel in place.

6. A modular cabinet system as specified in claim 1 and further comprising:

a formed sheet metal rear door panel adapted to be received within the rectangle formed by the rear upright and rear top and bottom tubular members;

said door panel including hinge means adapted to be inserted into holes formed inthe top and bottom rear horizontal members.

7. A modular cabinet system as specified in claim 6 and further comprising:

said door panel being provided with a plurality of air-circulation louvers;

said louvers each being formed by displacing an upwardly extending portion of the sheet metal panel away from the vertical plane of the panel and into the cabinet and removing a generally semi-circular portion of the sheet metal at each lateral end of said displaced portion.

8. A modular cabinet system as specified in claim 1 and further comprising:

top and bottom front door bracket means attached to respective top and bottom front horizontal members for rotatably holding thereon a front door panel.

9. A modular cabinet system as specified in claim 1 wherein:

said upright members and said horizontal members are constructed of one-inch outside side dimension, steel tubing of square cross-section.

10. A modular cabinet system as specified in claim 1 wherein:

the distance between said first and second vertical upright members is 19 inches.

11. A modular cabinet system as specified in claim 1 wherein:

the distance between said first and second vertical upright members is 24 inches.

12. A modular cabinet system as specified in claim 1 wherein:

the distance between said first and second vertical upright members is 30 inches.

* * * * *